(12) United States Patent
Sekine et al.

(10) Patent No.: US 10,133,079 B2
(45) Date of Patent: Nov. 20, 2018

(54) LASER DEVICE HAVING SEMICONDUCTOR LASER ARRAY STACKS

(71) Applicant: HAMAMATSU PHOTONICS K.K., Hamamatsu-shi, Shizuoka (JP)

(72) Inventors: Takashi Sekine, Hamamatsu (JP); Toshiyuki Kawashima, Hamamatsu (JP); Yasuki Takeuchi, Hamamatsu (JP); Yuma Hatano, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 135 days.

(21) Appl. No.: 14/900,288

(22) PCT Filed: May 23, 2014

(86) PCT No.: PCT/JP2014/063720
§ 371 (c)(1),
(2) Date: Dec. 21, 2015

(87) PCT Pub. No.: WO2015/001866
PCT Pub. Date: Jan. 8, 2015

(65) Prior Publication Data
US 2016/0370593 A1    Dec. 22, 2016

(30) Foreign Application Priority Data
Jul. 3, 2013    (JP) .................. 2013-139993

(51) Int. Cl.
*G02B 27/12* (2006.01)
*H01S 5/40* (2006.01)
(Continued)

(52) U.S. Cl.
CPC ............. *G02B 27/12* (2013.01); *G02B 5/04* (2013.01); *G02B 27/106* (2013.01); *H01S 5/005* (2013.01);
(Continued)

(58) Field of Classification Search
CPC ...... G02B 27/12; G02B 27/16; G02B 27/106; H01S 5/005; H01S 5/4012
(Continued)

(56) References Cited

U.S. PATENT DOCUMENTS 5,414,559 A    5/1995  Burghardt et al.
6,548,781 B1 * 4/2003  Brunwinkel ....... B23K 26/0604
                                                 219/121.73
(Continued)

FOREIGN PATENT DOCUMENTS

CN    1500223       5/2004
CN    102722027    10/2012
(Continued)

OTHER PUBLICATIONS

International Preliminary Report on Patentability dated Jan. 14, 2016 for PCT/JP2014/063720.

*Primary Examiner* — Zachary Wilkes
(74) *Attorney, Agent, or Firm* — Drinker Biddle & Reath LLP (57) ABSTRACT

Provided is a laser device including N semiconductor laser array stacks, a prismatic optical system that shifts optical axes of luminous fluxes respectively output from the N semiconductor laser array stacks so as to decrease intervals among the luminous fluxes, and an imaging optical system that causes the luminous fluxes to be condensed and deflected for each luminous flux. The imaging optical system causes the luminous fluxes to be deflected so that the luminous fluxes overlap each other at a predetermined position and generates a light-condensing point of the luminous fluxes between the imaging optical system and the predetermined position.

4 Claims, 9 Drawing Sheets

(51) Int. Cl.
  *G02B 27/10* (2006.01)
  *G02B 5/04* (2006.01)
  *H01S 5/00* (2006.01)
  *G02B 27/09* (2006.01)

(52) U.S. Cl.
  CPC .......... *H01S 5/4012* (2013.01); *H01S 5/4025* (2013.01); *G02B 27/0905* (2013.01); *G02B 27/0922* (2013.01); *G02B 27/1066* (2013.01); *H01S 5/405* (2013.01)

(58) Field of Classification Search
  USPC .......................... 359/629–640; 372/100–106
  See application file for complete search history.

(56) References Cited

U.S. PATENT DOCUMENTS

| | | |
|---|---|---|
| 7,639,722 B1 | 12/2009 | Paxton et al. |
| 7,680,170 B2 | 3/2010 | Hu et al. |
| 2004/0252744 A1* | 12/2004 | Anikitchev ........ G02B 27/0977 372/100 |
| 2005/0063435 A1 | 3/2005 | Imai et al. |
| 2007/0291813 A1 | 12/2007 | Hu et al. |
| 2012/0257387 A1 | 10/2012 | Kuchibhotla et al. |

FOREIGN PATENT DOCUMENTS

| | | |
|---|---|---|
| CN | 202720390 | 2/2013 |
| JP | S60-108802 | 6/1985 |
| JP | 2001-066546 | 3/2001 |
| JP | 2001-111147 A | 4/2001 |
| JP | 2002-148562 A | 5/2002 |
| JP | 2002-184206 A | 6/2002 |
| JP | 2003-103389 | 4/2003 |
| JP | 2004-096092 A | 3/2004 |
| JP | 2005-51135 A | 10/2005 |
| JP | 2008-021900 A | 1/2008 |
| JP | 2008-028019 | 2/2008 |
| JP | 2011-520292 | 7/2011 |
| JP | 2013-502717 | 1/2013 |
| JP | 2013-521666 | 6/2013 |
| JP | 2013-521667 | 6/2013 |
| WO | WO-2011/021140 A2 | 2/2011 |

* cited by examiner

LASER DEVICE HAVING SEMICONDUCTOR LASER ARRAY STACKS

TECHNICAL FIELD

An aspect of the present invention relates to a laser device.

BACKGROUND ART

Figure 9:
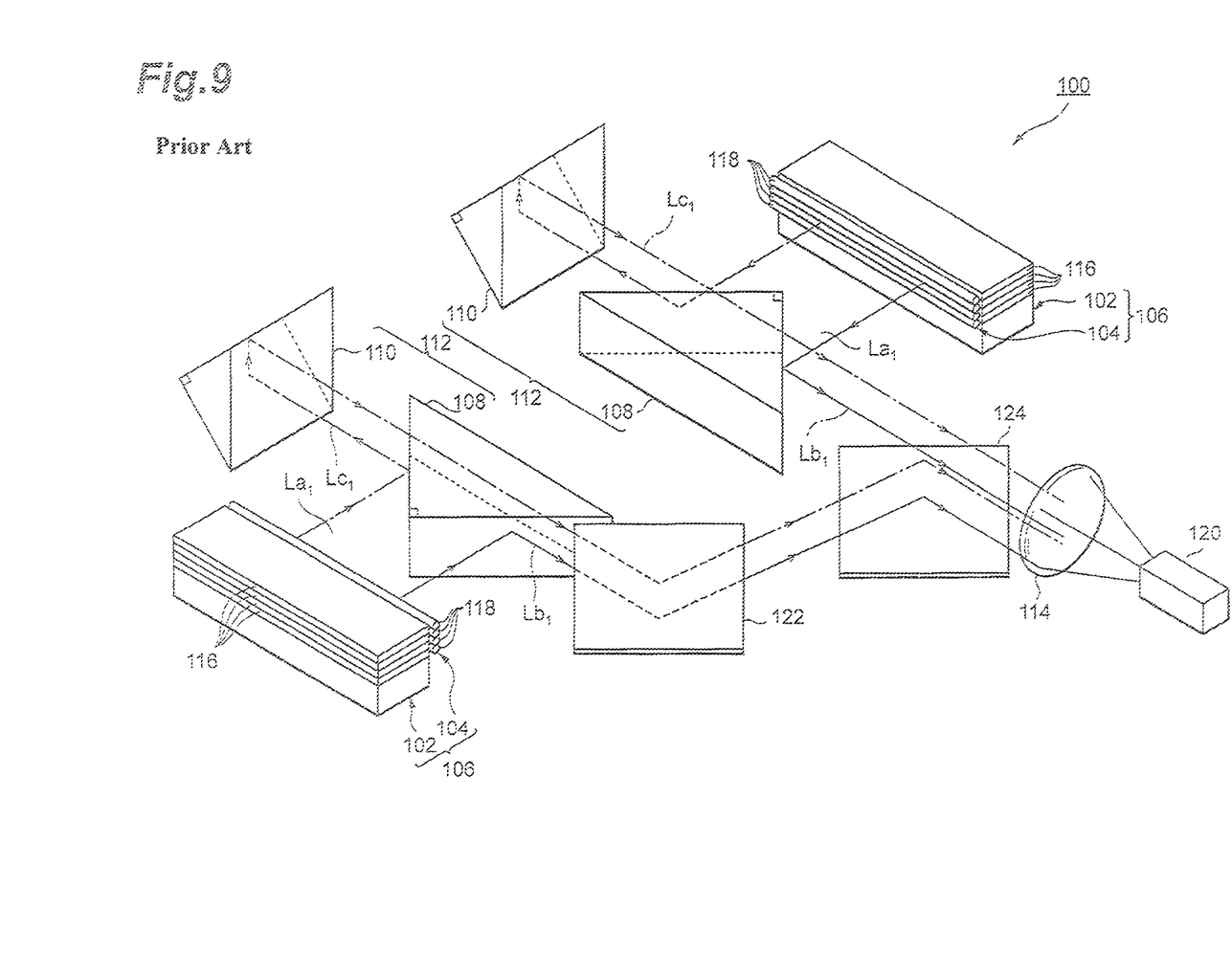
FIG. 9 is a perspective view illustrating the configuration of the light condensing unit disclosed in Patent Literature 1.

Patent Literature 1 discloses a technique related to a light condensing unit which is used for exciting a solid-state laser. FIG. 9 is a perspective view illustrating a configuration of a light condensing unit 100 disclosed in Patent Literature 1. As illustrated in FIG. 9, the light condensing unit 100 includes two light sources 106, two optical systems 112, and a light condensing lens 114. Each of the light sources 106 has a semiconductor laser array stack 102 and a cylindrical lens stack 104. The semiconductor laser array stack 102 is configured to include a plurality of stacked semiconductor laser arrays 116 each of which has a plurality of light emission regions. The cylindrical lens stack 104 is configured to include cylindrical lenses 118 which are arranged as many as the semiconductor laser arrays 116 in a stacking direction, and is installed in the vicinity of the plurality of light emission regions of the semiconductor laser array stack 102. In addition, the optical system 112 has prisms 108 and 110. The prism 108 is a right-angle prism having a triangular prismatic shape. A side surface thereof is subjected to total reflection coating. The prism 110 is a right-angle prism having a triangular prismatic shape. A light incident surface thereof is subjected to antireflection coating, and a total reflection surface is subjected to high-reflection coating. The light condensing lens 114 has a focal point inside a solid-state laser 120 which is an excitation target of the light condensing unit 100.

In the light condensing unit 100, a laser light $La_1$ is emitted from each of the light emission regions of the semiconductor laser arrays 116 of the semiconductor laser array stack 102. The laser light $La_1$ is subjected to collimation by each of the cylindrical lenses 118 of the cylindrical lens stack 104, and then, the laser light $La_1$ is reflected by two side surfaces of the prism 108, thereby being divided into a luminous flux $Lb_1$ and a luminous flux $Lc_1$. The luminous flux $Lc_1$ is reflected by the two total reflection surfaces of the prism 110, and then, the luminous flux $Lc_1$ passes over the prism 108, thereby being adjacent to the luminous flux $Lb_1$ in a parallel manner. Thereafter, optical paths of the luminous fluxes $Lb_1$ and $Lc_1$ are changed by reflection mirrors 122 and 124 as necessary, and then, the luminous fluxes $Lb_1$ and $Lc_1$ are caused to be condensed inside the solid-state laser 120 by the light condensing lens 114.

CITATION LIST

Patent Literature

[Patent Literature 1] Japanese Unexamined Patent Publication No. 2001-111147

SUMMARY OF INVENTION

Technical Problem

As a high power laser source, a semiconductor laser array stack configured to include a plurality of stacked semiconductor laser arrays each of which has a plurality of light emission regions is utilized. The semiconductor laser array stack is utilized as an excitation light source of a high energy solid-state laser device having a laser medium, for example. In such a semiconductor laser array stack, in order to enhance the quantity of a laser light, the number of the light emission regions can be increased, that is, more semiconductor laser arrays can be stacked, and/or more light emission regions can be provided in each of the semiconductor laser arrays. However, as the number of the light emission regions increases, the calorific value also increases. Therefore, from the viewpoint of the yield of an increase in size and assembly of a cooling device, it is more desirable to assemble a plurality of the semiconductor laser array stacks having appropriate sizes than to increase one semiconductor laser array stack in size.

When assembling the plurality of semiconductor laser array stacks, there is a need to cause laser luminous fluxes respectively emitted from the plurality of semiconductor laser array stacks to be converged into a single luminous flux. However, when the plurality of semiconductor laser array stacks are adjacent to each other, cooling thereof is likely to be insufficient and a cooling device is unavoidably increased in size in order to be sufficiently cooled. Therefore, it is desirable that the plurality of semiconductor laser array stacks are disposed at appropriate intervals thereamong. In this case, there is a need to cause a plurality of the laser luminous fluxes respectively emitted from the plurality of semiconductor laser array stacks to be converged into one flux by utilizing an optical system. For example, in a light condensing unit 100 illustrated in FIG. 9 as well, laser luminous fluxes emitted from two semiconductor laser array stacks 102 are converged into one flux by utilizing the optical system such as prisms 108 and 110, and reflection mirrors 122 and 124.

However, in the light condensing unit 100 disclosed in Patent Literature 1, the plurality of laser luminous fluxes are incident on a single light condensing lens 114 while having optical axes thereof aligned. Therefore, for example, when deterioration is generated in a portion of the semiconductor laser array stacks 102, the quantity of a laser light at a spot corresponding to the deteriorated portion is locally degraded in a solid-state laser 120 which is an irradiation target, and thus, the uniformity of the quantity of a laser light in the irradiation target is impaired.

An aspect of the present invention has been made in consideration of such a problem and an object thereof is to provide a laser device in which there is no need to cause a plurality of semiconductor laser array stacks to be adjacent to each other, and even though deterioration is generated in a portion of the semiconductor laser array stacks, it is possible to retain the uniformity of the quantity of a laser light in an irradiation target.

Solution to Problem

According to an aspect of the present invention, there is provided a laser device including N semiconductor laser array stacks (N is an integer of two or more) that are configured to include a plurality of semiconductor laser arrays each of which emits laser lights from two or more light emission regions being arranged in a predetermined direction while having emission directions aligned and which are stacked in a stacking direction intersecting the predetermined direction and the emission direction, and output the laser lights respectively emitted from the plurality of semiconductor laser arrays as one luminous flux; a first collimation portion that performs collimation in a fast axis direction for the laser lights included in the luminous flux; a prismatic optical system that allows the luminous fluxes which are respectively output from the N semiconductor laser array stacks and pass through the first collimation portion to penetrate therethrough, and shifts an optical axis of the luminous flux in a direction intersecting the optical axis so as to decrease an interval between the luminous fluxes; and an imaging optical system that condenses the luminous fluxes respectively output from the N semiconductor laser array stacks within a plane intersecting a slow axis direction for each luminous flux and deflects the optical axis of each of the luminous fluxes within the plane for each luminous flux. The imaging optical system deflects each of the luminous fluxes so that the N luminous fluxes overlap each other at a predetermined position and generates a light-condensing point of each of the luminous fluxes between the imaging optical system and the predetermined position.

In the laser device, as the optical axes of the luminous fluxes respectively emitted from the N semiconductor laser array stacks are shifted by the prismatic optical system, the intervals among the luminous fluxes decrease. Here, shifting of the optical axes of the luminous fluxes denotes that the optical axis of the luminous flux emitted from the prismatic optical system is moved in a direction intersecting the optical axis while being substantially parallel to the optical axis of the luminous flux incident on the prismatic optical system, for example. As such a prismatic optical system is provided, there is no need to cause the plurality of semiconductor laser array stacks to be adjacent to each other. Therefore, cooling can be sufficiently performed, and the cooling device can be prevented from increasing in size.

In addition, in the laser device, the imaging optical system condenses each of the luminous fluxes for each luminous flux so as to generate the light-condensing point of each of the luminous fluxes between the imaging optical system and a predetermined position. Accordingly, it is possible to enhance the uniformity of the quantity of a laser light at a predetermined position. For example, laser luminous fluxes having uniform light intensity can be applied to the irradiation target which is installed at a predetermined position. Moreover, in the laser device, the imaging optical system deflects the uniform N laser luminous fluxes for each luminous flux so as to overlap each other at a predetermined position. Accordingly, since the uniformly diffused N laser luminous fluxes overlap each other at a predetermined position, even though deterioration is generated in a portion of the semiconductor laser array stacks and affects one laser luminous flux thereof, it is possible to retain the uniformity of the quantity of light by the remaining laser luminous fluxes.

In the laser device, the imaging optical system may include N imaging lenses which condense each of the luminous fluxes respectively output from the N semiconductor laser array stacks for each luminous flux and N deflection optical elements which deflect the optical axes of each of the luminous fluxes for each luminous flux. Accordingly, it is possible to realize the imaging optical system.

In the laser device, the N semiconductor laser array stacks may be disposed side by side in the stacking direction, and the prismatic optical system may shift the optical axis of the luminous flux in the stacking direction. Due to such a configuration, it is possible to dispose the N semiconductor laser array stacks while realizing appropriate intervals among the semiconductor laser array stacks in the stacking direction.

In the laser device, a first group which includes one or a plurality of the semiconductor laser array stacks and a second group which includes one or the plurality of semiconductor laser array stacks may be disposed side by side in a predetermined direction. The prismatic optical system may shift the optical axis of the luminous flux in the predetermined direction so as to decrease an interval between the luminous flux emitted from the semiconductor laser array stack included in the first group and the luminous flux emitted from the semiconductor laser array stack included in the second group.

Advantageous Effects of Invention

In a laser device according to an aspect of the present invention, there is no need to cause a plurality of semiconductor laser array stacks to be adjacent to each other, and even though deterioration is generated in a portion of the semiconductor laser array stacks, it is possible to retain the uniformity of the quantity of a laser light in an irradiation target.

DESCRIPTION OF EMBODIMENTS

Hereinafter, embodiments of a laser device according to an aspect of the present invention will be described in detail with reference to the accompanying drawings. The same reference numerals and signs will be applied to the same elements in the description of the drawings, and the overlapping description will be omitted.

First Embodiment

Figure 1:
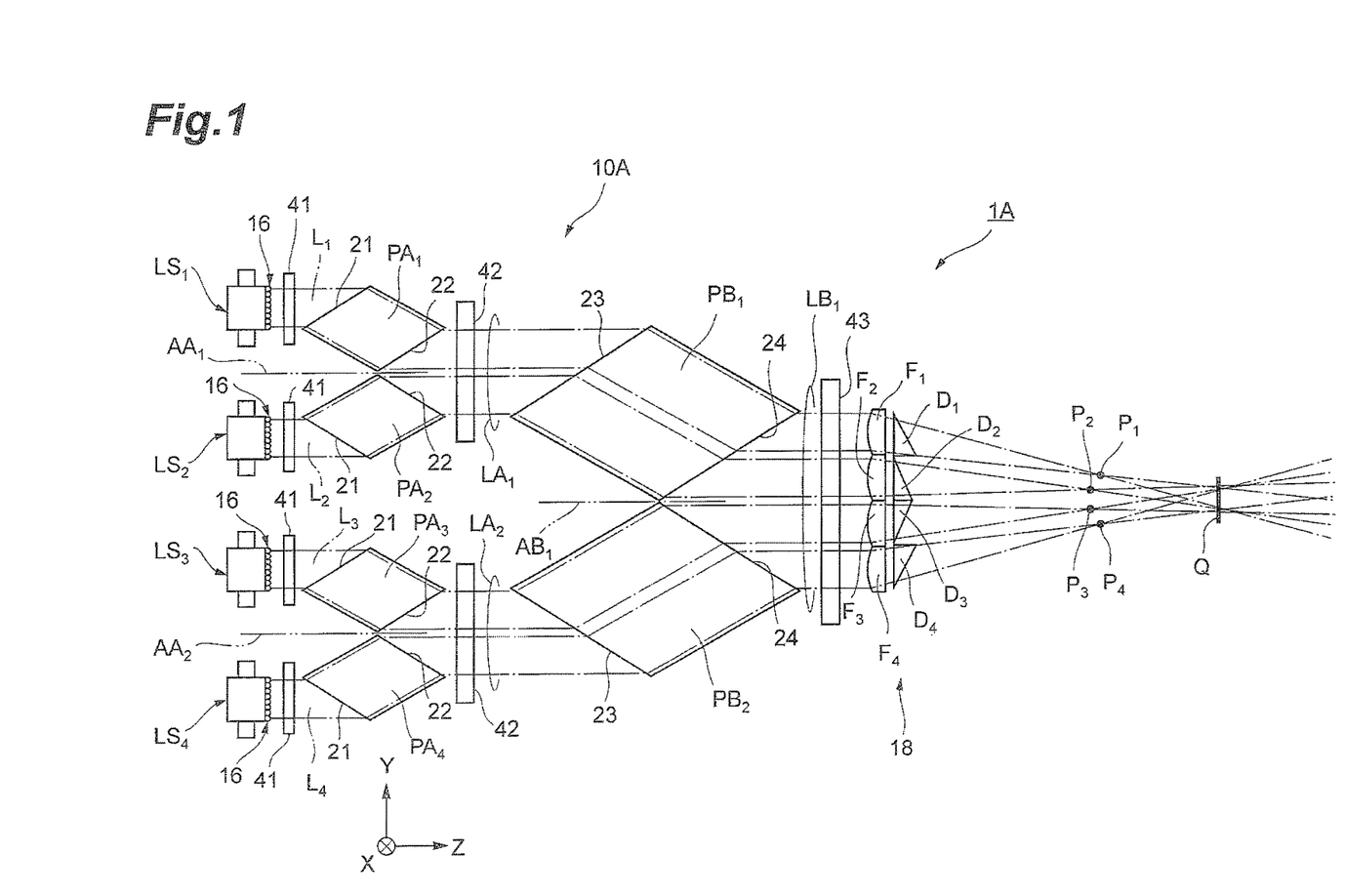
FIG. 1 is a plan view illustrating a configuration of a laser device of a first embodiment.
Figure 2:
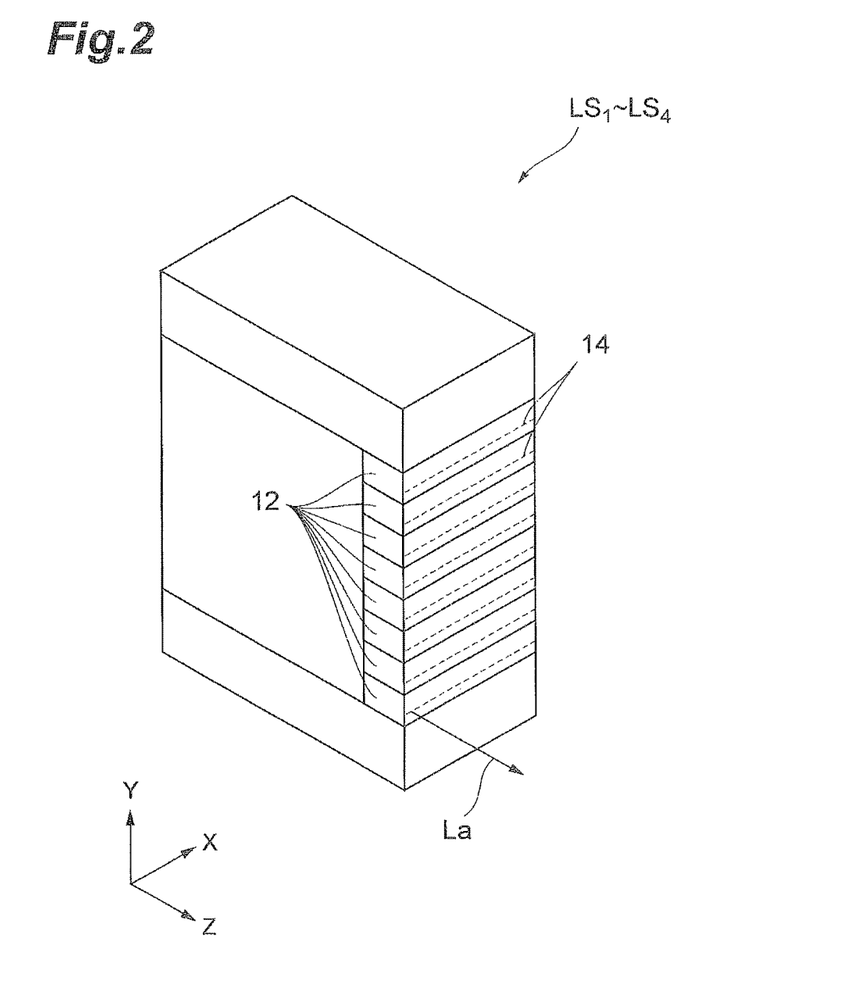
FIG. 2 is a perspective view illustrating a configuration of a semiconductor laser array stack included in the laser device.

FIG. 1 is a plan view illustrating a configuration of a laser device 1A of a first embodiment. In addition, FIG. 2 is a perspective view illustrating a configuration of semiconductor laser array stacks $LS_1$ to $LS_N$ included in the laser device 1A. In order to make the diagrams easy to understand, an XYZ orthogonal coordinate system is indicated in FIGS. 1 and 2.

As illustrated in FIG. 1, the laser device 1A of the present embodiment includes the N semiconductor laser array stacks $LS_1$ to $LS_N$ (N is an integer of two or more. The diagram exemplifies a case of N=4) and a prismatic optical system 10A. The semiconductor laser array stacks $LS_1$ to $LS_N$ are disposed side by side at intervals thereamong in a Y-axis direction. The prismatic optical system 10A has N first prisms $PA_1$ to $PA_N$ which are provided so as to correspond to the semiconductor laser array stacks $LS_1$ to $LS_N$ in a one-to-one manner, and the second prisms $PB_1$ to $PB_K$ (in this case, K=N/2). Both the first prisms $PA_1$ to $PA_N$ and the second prisms $PB_1$ to $PB_K$ are also disposed side by side in the Y-axis direction.

As illustrated in FIG. 2, each of the semiconductor laser array stacks $LS_1$ to $LS_N$ has a plurality of semiconductor laser arrays 12. Each of the semiconductor laser arrays 12 has two or more light emission regions 14 which are arranged in a predetermined direction (an X-axis direction in the present embodiment), and a laser light La is emitted from each of the light emission regions 14 in a certain light emission direction (a Z-axis direction in the present embodiment). A fast axis direction of the laser light La is parallel to the Y-axis direction, and a slow axis direction thereof is parallel to the X-axis direction. The plurality of semiconductor laser arrays 12 are stacked in a stacking direction (the Y-axis direction in the present embodiment) intersecting the predetermined direction (the X-axis direction) and the light emission direction (the Z-axis direction) while having the light emission directions aligned. Each of the semiconductor laser array stacks $LS_1$ to $LS_N$ outputs the laser lights La respectively emitted from the plurality of semiconductor laser arrays 12 as one luminous flux.

Repeatedly referring to FIG. 1, a laser luminous flux $L_n$ output from the nth semiconductor laser array stack $LS_n$ (n is an integer within a range from 1 to N) passes through a collimator lens stack 16. The collimator lens stack 16 is a first collimation portion in the present embodiment, is disposed so as to correspond to each of the semiconductor laser array stacks $LS_1$ to $LS_N$, and faces the light emission regions 14 of each of the semiconductor laser array stacks $LS_1$ to $LS_N$. The collimator lens stack 16 extends in the X-axis direction and has a plurality of cylindrical lenses respectively corresponding to the plurality of semiconductor laser arrays 12. Each of the cylindrical lenses performs collimation in the fast axis direction for the laser light La emitted from the corresponding semiconductor laser array 12.

The laser luminous flux $L_n$ subjected to collimation in the fast axis direction by the collimator lens stack 16 is incident on a light incident surface 21 of a corresponding nth first prism $PA_n$. Each of the first prisms $PA_1$ to $PA_N$ is a prism made from a transparent material such as glass and quartz, for example, and has the light incident surface 21 and a light emission surface 22. In each of the first prisms $PA_1$ to $PA_N$ of the present embodiment, a cross section along the YZ plane exhibits a shape of a parallelogram (for example, a rhombic shape). One side of the parallelogram serves as the light incident surface 21, and a different side parallel to the one side serves as the light emission surface 22.

The nth first prism $PA_n$ allows the laser luminous flux $L_n$ incident on the light incident surface 21 to penetrate therethrough and emits the laser luminous flux $L_n$ from the light emission surface 22. The light incident surface 21 tilts to the XZ plane, and when the laser luminous flux $L_n$ is incident on the light incident surface 21, the laser luminous flux $L_n$ is refracted by a predetermined angle with respect to the light emission direction (the Z-axis direction). In addition, the light emission surface 22 is parallel to the light incident surface 21, and when the laser luminous flux $L_n$ is emitted from the light emission surface 22, the laser luminous flux $L_n$ is refracted again by the predetermined angle in a direction opposite to that of the previous refraction, thereby travelling again in the light emission direction (the Z-axis direction). In this manner, the first prism $PA_n$ shifts the optical axis of the laser luminous flux $L_n$ in a direction intersecting the optical axis (the Y-axis direction in the present embodiment). In other words, the first prism $PA_n$ causes the optical axis of the laser luminous flux $L_n$ emitted from the light emission surface 22 to move in the Y-axis direction while being substantially parallel to the optical axis of the laser luminous flux $L_n$ incident on the light incident surface 21.

In addition, in the present embodiment, a (2k−1)th first prism $PA_{2k-1}$ (in this case, k is an integer within a range from 1 to K) and a 2kth first prism $PA_{2k}$ are disposed adjacent to each other in the Y-axis direction. The light incident surface 21 and the light emission surface 22 of the first prism $PA_{2k-1}$, and the light incident surface 21 and the light emission surface 22 of the first prism $PA_{2k}$ are disposed at positions symmetrical to each other while interposing a reference surface $AA_k$ therebetween along the XZ plane. Then, a laser luminous flux $L_{2k-1}$ incident on the light incident surface 21 of the first prism $PA_{2k-1}$ is refracted in a direction of approaching an adjacent laser luminous flux $L_{2k}$. In addition, the laser luminous flux $L_{2k}$ incident on the light incident surface 21 of the first prism $PA_{2k}$ is refracted in a direction of approaching an adjacent laser luminous flux $L_{2k-1}$. Accordingly, when the laser luminous fluxes $L_{2k-1}$ and $L_{2k}$ are emitted from the light emission surface 22, the interval between the laser luminous fluxes $L_{2k-1}$ and $L_{2k}$ decreases, thereby forming a laser luminous flux group $LA_k$ configured to include a pair of the luminous fluxes $L_{2k-1}$ and $L_{2k}$. The laser luminous flux group $LA_k$ travels in the original light emission direction (the Z-axis direction). The laser luminous fluxes $L_{2k-1}$ and $L_{2k}$ configuring the laser luminous flux group $LA_k$ of the present embodiment travel while being adjacent to each other. However, the laser luminous fluxes $L_{2k-1}$ and $L_{2k}$ do not overlap each other and have an interval of approximately 1 mm therebetween, for example.

Each of the second prisms $PB_1$ to $PB_K$ is a prism made from a transparent material such as glass and quartz, for example, and has a light incident surface 23 and a light emission surface 24. Similar to the first prisms $PA_1$ to $PA_N$, in each of the second prisms $PB_1$ to $PB_K$ of the present embodiment, a cross section along the YZ plane exhibits a shape of a parallelogram (for example, a rhombic shape). One side of the parallelogram serves as the light incident surface 23, and a different side parallel to the one side serves as the light emission surface 24.

The laser luminous fluxes $L_{2k-1}$ and $L_{2k}$ respectively emitted from the first prisms $PA_{2k-1}$, and $PA_{2k}$ are incident on the light incident surface 23 of a kth second prism $PB_k$ as the laser luminous flux group $LA_k$. The second prism $PB_k$ allows the laser luminous flux group $LA_k$ incident on the light incident surface 23 to penetrate therethrough and emits the laser luminous flux group $LA_k$ from the light emission surface 24. The light incident surface 23 tilts to the XZ plane, and when the laser luminous flux group $LA_k$ is incident on the light incident surface 23, the laser luminous flux group $LA_k$ is refracted by a predetermined angle with respect to the light emission direction (the Z-axis direction). In addition, the light emission surface 24 is parallel to the light incident surface 23, and when the laser luminous flux group $LA_k$ is emitted from the light emission surface 24, the laser luminous flux group $LA_k$ is refracted again by the predetermined angle in a direction opposite to that of the previous refraction, thereby travelling again in the light emission direction (the Z-axis direction). In this manner, the second prism $PB_k$ shifts the optical axis of the laser luminous flux group $LA_k$ in a direction intersecting the optical axis (the Y-axis direction in the present embodiment). In other words, the second prism $PB_k$ causes the optical axis of the laser luminous flux group $LA_k$ emitted from the light emission surface 24 to move in the Y-axis direction while being substantially parallel to the optical axis of the laser luminous flux group $LA_k$ incident on the light incident surface 23.

In addition, in the present embodiment, a (2m−1)th second prism $PB_{2m-1}$ (in this case, m is an integer within a range from 1 to M. M=N/4) and a (2m)th second prism $PB_{2m}$ are disposed adjacent to each other in the Y-axis direction. The light incident surface 23 and the light emission surface 24 of the second prism $PB_{2m-1}$, and the light incident surface 23 and the light emission surface 24 of the second prism $PB_{2m}$ are disposed at positions symmetrical to each other while interposing a reference surface $AB_m$ therebetween along the XZ plane. Accordingly, a laser luminous flux group $LA_{2m-1}$ incident on the light incident surface 23 of the second prism $PB_{2m-1}$ is refracted in a direction of approaching an adjacent laser luminous flux group $LA_{2m}$. In addition, the laser luminous flux group $LA_{2m}$ incident on the light incident surface 23 of the second prism $PB_{2m}$ is refracted in a direction of approaching an adjacent laser luminous flux group $LA_{2m-1}$. Accordingly, when the laser luminous flux groups $LA_{2m-1}$ and $LA_{2m}$ are emitted from the light emission surface 24, the interval between the laser luminous flux groups $LA_{2m-1}$ and $LA_{2m}$ decreases, thereby forming a laser luminous flux group $LB_m$ configured to include a pair of the laser luminous flux groups $LA_{2m-1}$ and $LA_{2m}$. The laser luminous flux group $LB_m$ travels in the original light emission direction (the Z-axis direction). The laser luminous flux groups $LA_{2m-1}$ and $LA_{2m}$ configuring the laser luminous flux group $LB_m$ of the present embodiment travel while being adjacent to each other. However, the laser luminous flux groups $LA_{2m-1}$ and $LA_{2m}$ do not overlap each other and have an interval of approximately 1 mm therebetween, for example. In other words, one laser luminous flux group $LB_m$ includes four laser luminous fluxes $L_n$. The laser luminous fluxes $L_n$ are arranged side by side in the Y-axis direction without overlapping each other and have an interval of approximately 1 mm between adjacent laser luminous fluxes, for example.

The laser device 1A of the present embodiment also includes an imaging optical system 18. The imaging optical system 18 causes each of laser luminous fluxes $L_1$ to $L_N$ which has penetrated through the first prisms $PA_1$ to $PA_N$ and the second prisms $PB_1$ to $PB_K$ to be condensed within a plane intersecting the slow axis direction (within the YZ plane in the present embodiment) for each laser luminous flux. In addition, the imaging optical system 18 causes the optical axis of each of the laser luminous fluxes $L_1$ to $L_N$ to be deflected within the plane thereof for each laser luminous flux.

Specifically, the imaging optical system 18 is configured to include N imaging lenses $F_1$ to $F_N$ and N deflection optical elements $D_1$ to $D_N$. The imaging lenses $F_1$ to $F_N$ are provided so as to correspond to the N laser luminous fluxes $L_1$ to $L_N$ in a one-to-one manner, and the nth imaging lens $F_n$ causes the corresponding laser luminous flux $L_n$ to be condensed within the YZ plane. In the present embodiment, the imaging lenses $F_1$ to $F_N$ have no condensing operation within the XZ plane, and thus, the laser luminous fluxes $L_1$ to $L_N$ are not condensed within the XZ plane.

In addition, the imaging lenses $F_1$ to $F_N$ respectively generate light-condensing points $P_1$ to $P_N$ of the laser luminous fluxes $L_1$ to $L_N$ between the imaging optical system 18 and a predetermined position Q in the Z-axis direction. In more detail, focal distances of the imaging lenses $F_1$ to $F_N$ are shorter than the distance between the imaging optical system 18 and the predetermined position Q. The laser luminous fluxes $L_1$ to $L_N$ are converged once in front of the predetermined position Q, and then, the laser luminous fluxes $L_1$ to $L_N$ pass through the predetermined position Q while being diffused again.

Deflection optical elements $D_1$ to $D_N$ are provided so as to correspond to the N laser luminous fluxes $L_1$ to $L_N$ in a one-to-one manner, and an nth deflection optical element $D_n$ causes the corresponding laser luminous flux $L_n$ to be deflected within the YZ plane. Here, deflection of the laser luminous flux $L_n$ denotes that the direction of the optical axis of the laser luminous flux $L_n$ is slightly changed. In the present embodiment, the optical axis of the laser luminous flux $L_n$ slightly tilts in the Y-axis direction with respect to the Z-axis direction as a reference.

Such deflection of the laser luminous flux $L_n$ is performed so as to cause the N laser luminous fluxes $L_1$ to $L_N$ to overlap each other at the predetermined position Q in the Z-axis direction. In other words, the optical axes of the laser luminous fluxes $L_1$ to $L_N$ viewed in the X-axis direction respectively pass through the deflection optical elements $D_1$ to $D_N$, and then, the optical axes thereof overlap each other at the predetermined position Q. Each of the deflection optical elements $D_1$ to $D_N$ having such an operation is realized by a wedge prism, for example. An irradiation target is disposed at the predetermined position Q, for example. As the irradiation target, for example, it is possible to exemplify a solid-state laser medium which is disposed on a resonance optical path of a laser resonator and generates emission light as excitation light is supplied.

The laser device 1A of the present embodiment also includes slow axis collimator lenses 41, 42, and 43. The slow axis collimator lens 41 is a second collimation portion of the present embodiment, and the slow axis collimator lens 43 is a third collimation portion of the present embodiment. The slow axis collimator lens 41 is disposed on the optical axis between the collimator lens stack 16 and the first prisms $PA_1$ to $PA_N$. The slow axis collimator lens 41 performs collimation in the slow axis direction (the X-axis direction in the present embodiment) for the laser light La included in the laser luminous flux $L_n$. The slow axis collimator lens 42 is disposed on the optical axis between the first prisms $PA_1$ to $PA_N$ and the second prisms $PB_1$ to $PB_K$. The slow axis collimator lens 42 performs collimation in the slow axis direction for the laser light La included in the laser luminous flux group $LA_k$. The slow axis collimator lens 43 is disposed on the optical axis between the second prisms $PB_1$ to $PB_K$ and the imaging optical system 18. The slow axis collimator lens 43 performs collimation in the slow axis direction for the laser light La included in the laser luminous flux group $LB_m$.

Description will be given regarding an effect which can be obtained by the laser device 1A of the present embodiment having the above-described configuration. In the laser device 1A, as the optical axes of the laser luminous fluxes $L_1$ to $L_N$ respectively emitted from the N semiconductor laser array stacks $LS_1$ to $LS_N$ are shifted by the prismatic optical system 10A (the first prisms $PA_1$ to $PA_N$ and the second prisms $PB_1$ to $PB_K$), the intervals among the laser luminous fluxes $L_1$ to $L_N$ decrease. As such a prismatic optical system 10A is provided, there is no need to cause a plurality of the semiconductor laser array stacks $LS_1$ to $LS_N$ to be adjacent to each other. Therefore, cooling can be sufficiently performed by utilizing gaps among the semiconductor laser array stacks $LS_1$ to $LS_N$, and since it is enough for a cooling device to have a simple configuration, the cooling device can be prevented from increasing in size. Moreover, since the laser luminous fluxes $L_1$ to $L_N$ can be collected through a simple configuration such as a prismatic optical system 10A, the laser device 1A can be miniaturized further.

In addition, according to the laser device 1A, since the laser luminous fluxes $L_1$ to $L_N$ are transmitted by using the prismatic optical system 10A, long-distance transmission (for example, 1 m or longer) of the laser luminous fluxes $L_1$ to $L_N$ can be performed in a small space with low loss (for example, several percent or lower). In addition, it is possible to have highly uniform spatial intensity distribution at the arbitrary position Q, and the laser luminous fluxes $L_1$ to $L_N$ can be converged within a region having an arbitrary size (for example, 1 cm$^2$) with sufficient light intensity (for example, several ten kW/cm$^2$ or greater).

In addition, in the laser device 1A, the imaging optical system 18 causes each of the laser luminous fluxes $L_1$ to $L_N$ to be condensed for each luminous flux and generates the light-condensing points $P_1$ to $P_N$ of each of the laser luminous fluxes $L_1$ to $L_N$ between the imaging optical system 18 and the predetermined position Q. Accordingly, it is possible to enhance the uniformity of the quantity of the laser light at the predetermined position Q. For example, laser luminous fluxes having uniform light intensity can be applied to the irradiation target which is installed at the predetermined position Q. Moreover, in the laser device 1A, the imaging optical system 18 causes the uniform N laser luminous fluxes $L_1$ to $L_N$ to be deflected for each luminous flux so as to overlap each other at the predetermined position Q. Accordingly, since the uniform N laser luminous fluxes $L_1$ to $L_N$ overlap each other at the predetermined position Q, even though deterioration is generated in a portion of any one of the semiconductor laser array stacks $LS_1$ to $LS_N$ and affects one laser luminous flux $L_n$ thereof, it is possible to retain the uniformity of the quantity of light of the laser luminous flux group $LB_m$ by the remaining laser luminous fluxes.

For example, when a laser source device is used for exciting the solid-state laser medium, intensity fluctuation in the spatial pattern of excitation light significantly affects the output characteristics (stability of energy and uniformity of the pattern) of the solid-state laser medium and causes optical damage to the optical elements and the like. According to the laser device 1A of the present embodiment, since uniformity of the quantity of light of the laser luminous flux group $LB_m$ can be retained, it is possible to stabilize the output characteristics of the solid-state laser medium and to reduce the optical damage to the optical elements and the like.

In addition, in the laser device 1A, when it is intended to increase or decrease the number N of the semiconductor laser array stacks $LS_1$ to $LS_N$, there is no need for a large-scaled structural change, and only the numbers of the first prisms $PA_1$ to $PA_N$ and the second prisms $PB_1$ to $PB_K$ included in the prismatic optical system 10A, and the imaging lenses $F_1$ to $F_N$ and the deflection optical elements $D_1$ to $D_N$ included in the imaging optical system 18 may be increased or decreased. Therefore, according to the laser device 1A, it is possible to provide the laser device 1A in which the quantity of irradiation light is easily increased and decreased and diffusibility is high.

In addition, in such a manner of the present embodiment, the N semiconductor laser array stacks $LS_1$ to $LS_N$ may be disposed side by side in the stacking direction, and the prismatic optical system 10A may shift the optical axes of the laser luminous fluxes $L_1$ to $L_N$ in the stacking direction.

According to such a configuration, it is possible to dispose the semiconductor laser array stacks $LS_1$ to $LS_N$ while realizing appropriate intervals among the N semiconductor laser array stacks $LS_1$ to $LS_N$ in the stacking direction.

In place of the prismatic optical system 10A, it is possible to consider that the laser luminous fluxes $L_1$ to $L_N$ are shifted by using a reflection mirror. However, in case of a reflection mirror, when an incident angle of the laser luminous flux varies to be in a certain direction, an emission angle thereof varies to be in a direction opposite thereto. Therefore, the optical paths of the N laser luminous fluxes $L_1$ to $L_N$ significantly deviate from each other, resulting in a problem in that it is difficult to accurately arrange the optical paths. In contrast, in case of a prism, since the incident angle and the emission angle of the laser luminous flux vary to be in the same direction, the optical paths of the N laser luminous fluxes $L_1$ to $L_N$ are prevented from deviating. Thus, it is possible to widen a tolerance at the time of installing the N semiconductor laser array stacks $LS_1$ to $LS_N$.

Second Embodiment

Figure 3:
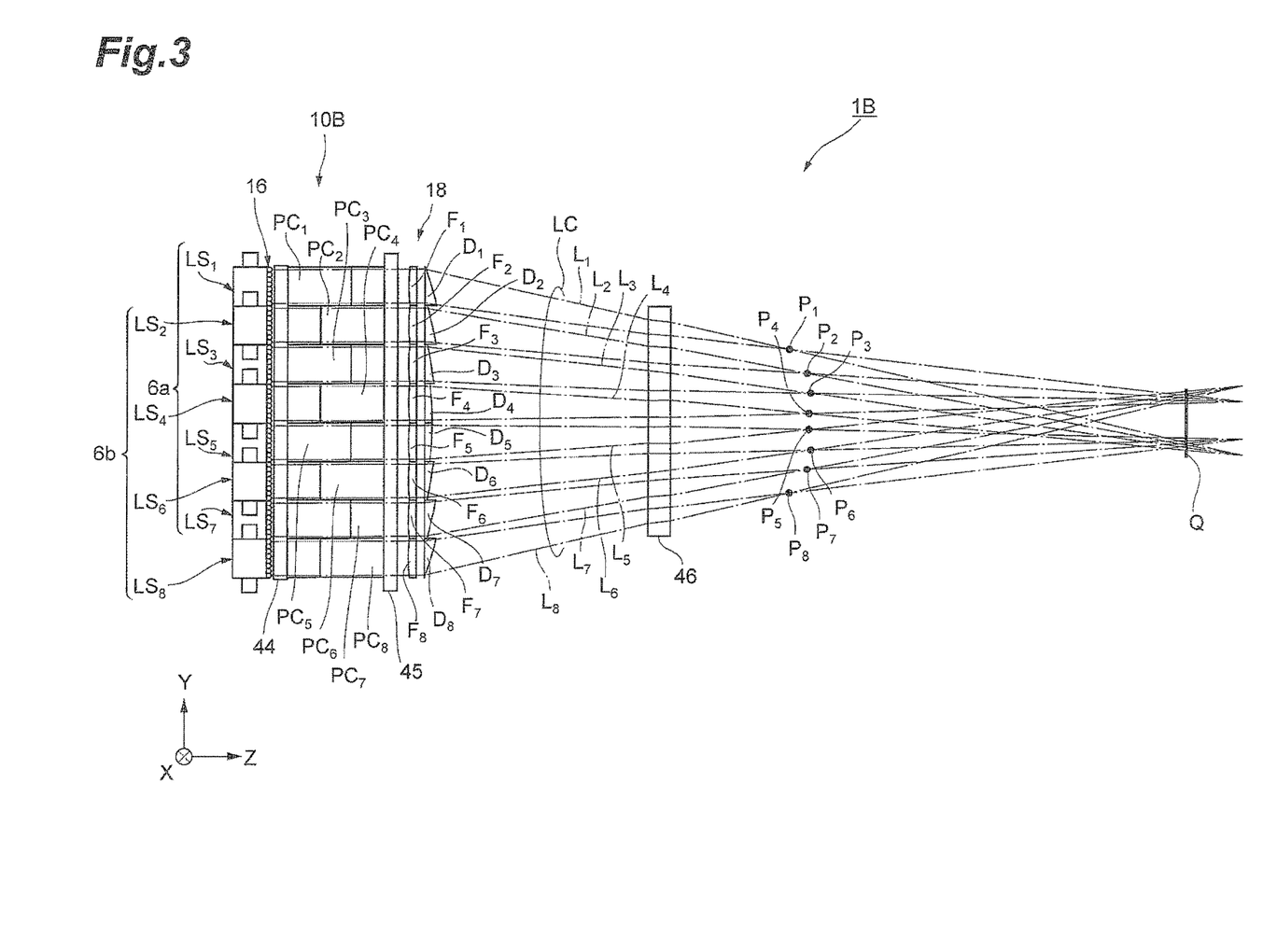
FIG. 3 is a plan view illustrating a configuration of a laser device of a second embodiment.
Figure 4:
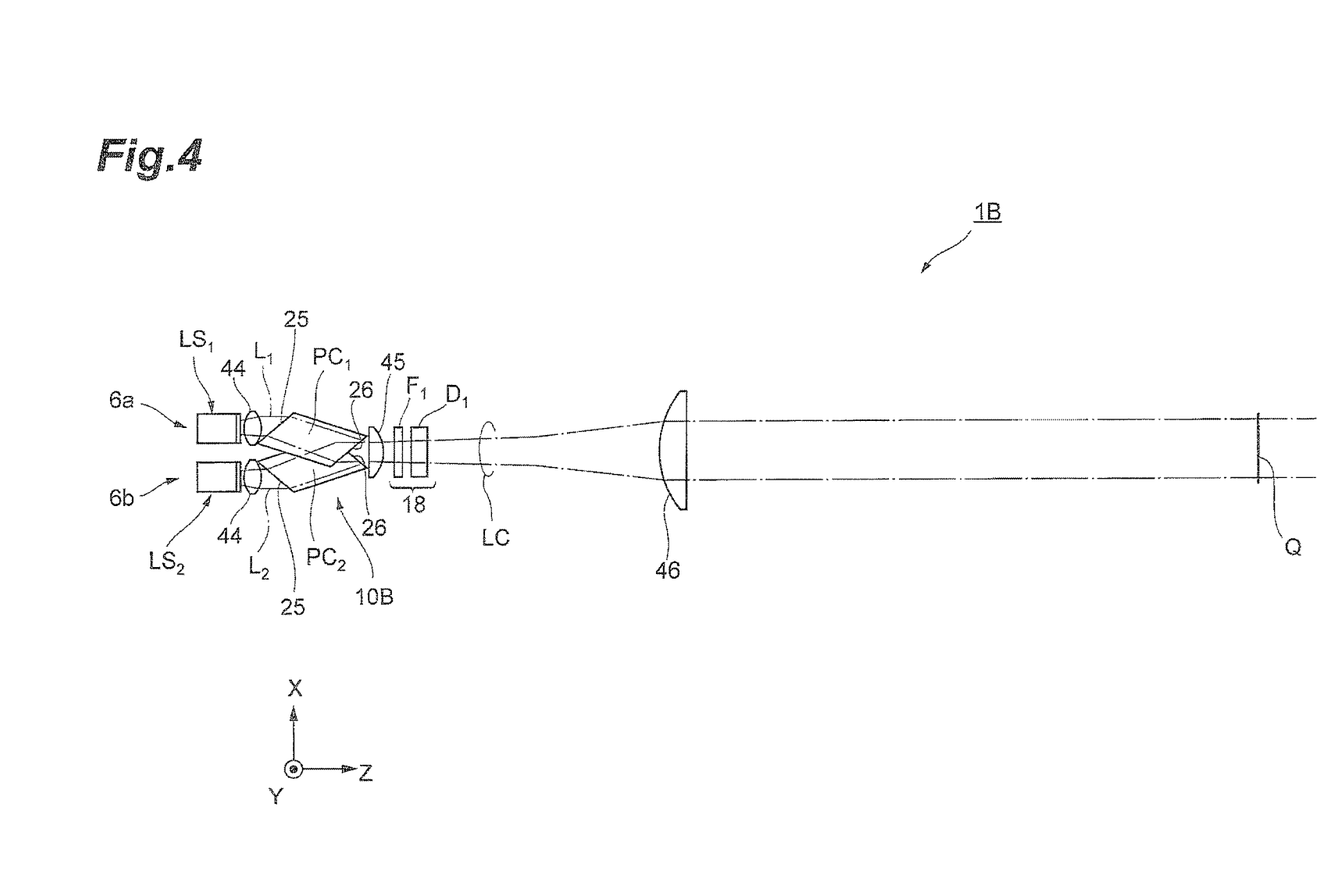
FIG. 4 is a side view of the laser device illustrated in FIG. 3 when viewed in a Y-axis direction.
Figure 5:
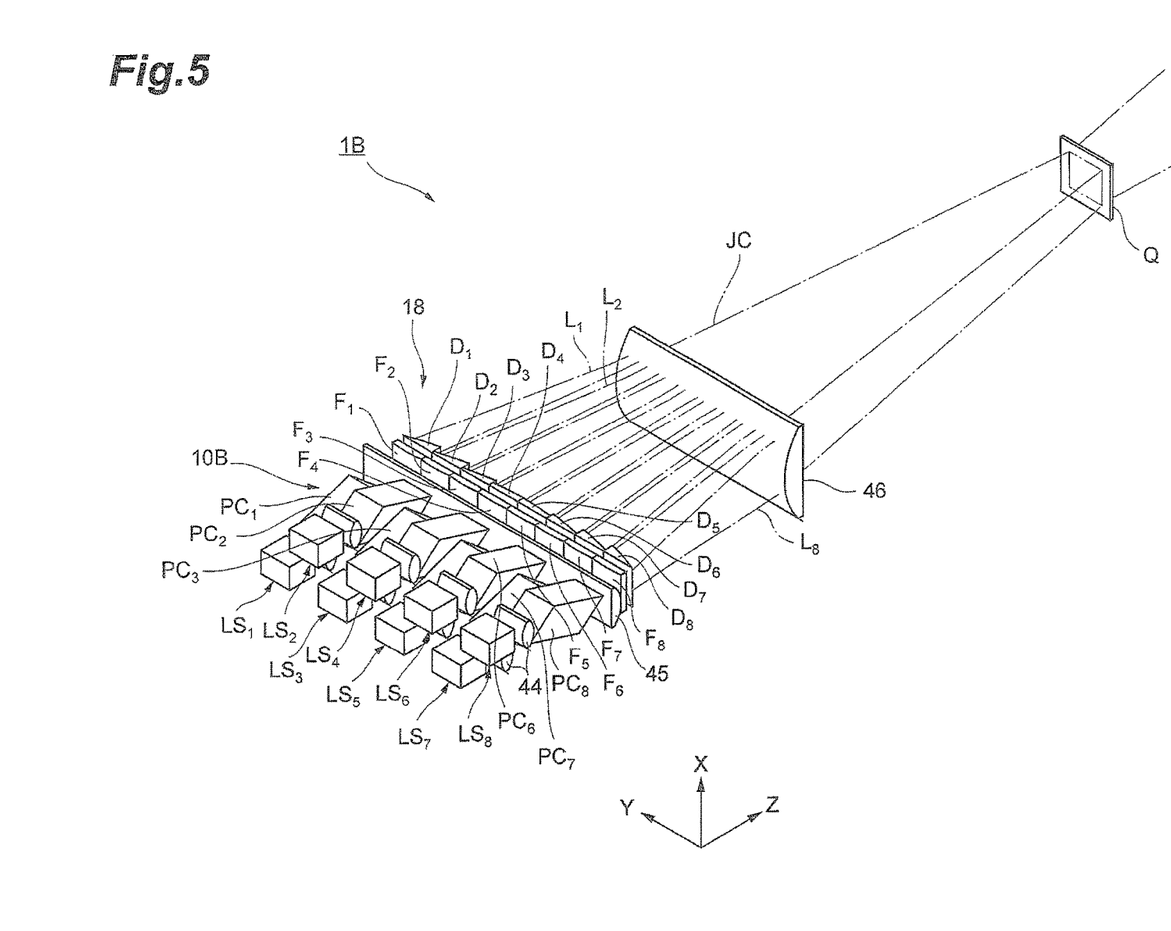
FIG. 5 is a perspective view illustrating the configuration of the laser device illustrated in FIG. 3.

FIG. 3 is a plan view illustrating a configuration of a laser device 1B of a second embodiment. FIG. 4 is a side view of the laser device 1B illustrated in FIG. 3 when viewed in the Y-axis direction. FIG. 5 is a perspective view illustrating the configuration of the laser device 1B illustrated in FIG. 3. As illustrated in FIGS. 3 to 5, the laser device 1B of the present embodiment includes the N semiconductor laser array stacks $LS_1$ to $LS_N$ (N is an integer of two or more. The diagram exemplifies a case of N=8), a prismatic optical system 10B, the collimator lens stack 16, and the imaging optical system 18. Since the configurations of the semiconductor laser array stacks $LS_1$ to $LS_N$ themselves, the disposition and the configuration of the collimator lens stack 16, and the configuration of the imaging optical system 18 are similar to those of the above-described first embodiment, detailed descriptions thereof will be omitted.

Semiconductor laser array stacks $LS_1$, $LS_3$, and so on to $LS_{2K-1}$ (in this case, K=N/2) among the N semiconductor laser array stacks $LS_1$ to $LS_N$ are configured to be included in a first group 6a, and the remaining semiconductor laser array stacks $LS_2$, $LS_4$, and so on to $LS_{2K}$ are configured to be included in a second group 6b. The first group 6a and the second group 6b are disposed alternately side by side in a predetermined direction (the X-axis direction). In addition, the semiconductor laser array stacks $LS_1$, $LS_3$, and so on to $LS_{2K-1}$ included in the first group 6a are disposed side by side at intervals thereamong in the Y-axis direction. Similarly, the semiconductor laser array stacks $LS_2$, $LS_4$, and so on to $LS_{2K}$ included in the second group 6b are disposed side by side at intervals thereamong in the Y-axis direction. Moreover, each of the positions of the semiconductor laser array stacks $LS_1$ to $LS_N$ in the Y-axis direction is determined so as to cause the semiconductor laser array stacks $LS_1$, $LS_3$, and so on to $LS_{2K-1}$ and the semiconductor laser array stacks $LS_2$, $LS_4$, and so on to $LS_{2K}$ to alternate with each other when viewed in the X-axis direction.

The prismatic optical system 10B has N prisms $PC_1$ to $PC_N$ which are provided so as to correspond to the semiconductor laser array stacks $LS_1$ to $LS_N$ in a one-to-one manner. The prisms $PC_1$, $PC_3$, and so on to $PC_{2K-1}$ among the N prisms $PC_1$ to $PC_N$ are disposed side by side along the corresponding semiconductor laser array stacks $LS_1$, $LS_3$, and so on to $LS_{2K-1}$ in the Y-axis direction, and the prisms $PC_2$, $PC_4$, and so on to $PC_{2K}$ are disposed side by side along the corresponding semiconductor laser array stacks $LS_2$, $LS_4$, and so on to $LS_{2K}$ in the Y-axis direction. In addition, the prisms $PC_1$, $PC_3$, and so on to $PC_{2K-1}$ and the prisms $PC_2$, $PC_4$, and so on to $PC_{2K}$ are alternately arranged in the Y-axis direction.

The laser luminous flux $L_n$ emitted from the nth semiconductor laser array stack $LS_n$ is subjected to collimation in the fast axis direction by the collimator lens stack 16, thereby being incident on a light incident surface 25 of the corresponding nth prism $PC_n$ (refer to FIG. 4). Each of the prisms $PC_1$ to $PC_N$ is a prism made from a transparent material such as glass and quartz, for example, and has the light incident surface 25 and a light emission surface 26 (refer to FIG. 4). In each of the prisms $PC_1$ to $PC_N$ of the present embodiment, a cross section along the XZ plane exhibits a shape of a parallelogram (for example, a rhombic shape). One side of the parallelogram serves as the light incident surface 25, and a different side parallel to the one side serves as the light emission surface 26.

The nth prism $PC_n$ allows the laser luminous flux $L_n$ incident on the light incident surface 25 to penetrate therethrough and emits the laser luminous flux $L_n$ from the light emission surface 26. The light incident surface 25 tilts to the YZ plane, and when the laser luminous flux $L_n$ is incident on the light incident surface 25, the laser luminous flux $L_n$ is refracted by a predetermined angle with respect to the light emission direction (the Z-axis direction). In addition, the light emission surface 26 is parallel to the light incident surface 25, and when the laser luminous flux $L_n$ is emitted from the light emission surface 26, the laser luminous flux $L_n$ is refracted again by the predetermined angle in a direction opposite to that of the previous refraction, thereby travelling again in the light emission direction (the Z-axis direction). In this manner, the prism $PC_n$ shifts the optical axis of the laser luminous flux $L_n$ in a direction intersecting the optical axis (the X-axis direction in the present embodiment). In other words, the prism $PC_n$ causes the optical axis of the laser luminous flux $L_n$ emitted from the light emission surface 26 to move in the X-axis direction while being substantially parallel to the optical axis of the laser luminous flux $L_n$ incident on the light incident surface 25.

In addition, in the present embodiment, the laser luminous fluxes $L_1$, $L_3$, and so on to $L_{2K-1}$ respectively incident on the light incident surfaces 25 of the prisms $PC_1$, $PC_3$, and so on to $PC_{2K-1}$ are refracted in a direction of approaching the adjacent laser luminous fluxes $L_2$, $L_4$, and so on to $L_{2K}$ (for example, the negative X-axis direction) when viewed in the Y-axis direction. The laser luminous fluxes $L_2$, $L_4$, and so on to $L_{2K}$ respectively incident on the light incident surfaces 25 of the prisms $PC_2$, $PC_4$, and so on to $PC_{2K}$ are refracted in a direction of approaching the adjacent laser luminous fluxes $L_1$, $L_3$, and so on to $L_{2K-1}$ (for example, the positive X-axis direction) when viewed in the Y-axis direction. Accordingly, when the laser luminous fluxes $L_1$, $L_2$, and so on to $L_{2K-1}$, and $L_{2K}$ are emitted from the light emission surface 26, the intervals between the laser luminous fluxes $L_1$, $L_3$, and so on to $L_{2K-1}$ and the laser luminous fluxes $L_2$, $L_4$, and so on to $L_{2K}$ decrease, thereby forming a single laser luminous flux group LC configured to include the laser luminous fluxes $L_1$, $L_2$, and so on to $L_{2K-1}$, and $L_{2K}$. The laser luminous flux group LC travels in the original light emission direction (the Z-axis direction). The laser luminous fluxes $L_1$, $L_2$, and so on to $L_{2K-1}$, and $L_{2K}$ configuring the laser luminous flux group LC of the present embodiment travel while being adjacent to each other. However, the laser luminous fluxes $L_1$, $L_2$, and so on to $L_{2K-1}$, and $L_{2K}$ do not overlap each other and have intervals of approximately 1 mm thereamong.

The laser device 1B of the present embodiment also includes slow axis collimator lenses 44, 45, and 46. The slow axis collimator lens 44 is a second collimation portion of the present embodiment, and the slow axis collimator lens 45 is a third collimation portion of the present embodiment. The slow axis collimator lens 44 is disposed on the optical axis between the collimator lens stack 16 and the prisms $PC_1$ to $PC_N$. The slow axis collimator lens 44 performs collimation in the slow axis direction (the X-axis direction in the present embodiment) for the laser light La included in the laser luminous flux $L_n$ (refer to FIG. 2). The slow axis collimator lens 45 is disposed on the optical axis between the prisms $PC_1$ to $PC_N$ and the imaging optical system 18. The slow axis collimator lens 45 performs collimation in the slow axis direction for the laser light La included in the laser luminous flux group LC. The slow axis collimator lens 46 is disposed on the optical axis between the imaging optical system 18 and the light-condensing points $P_1$ to $P_N$. The slow axis collimator lens 46 performs collimation in the slow axis direction for the laser light La included in the laser luminous flux group LC.

In the laser device 1B of the present embodiment having the above-described configuration, as the optical axes of the laser luminous fluxes $L_1$ to $L_N$ respectively emitted from the N semiconductor laser array stacks $LS_1$ to $LS_N$ are shifted by the prismatic optical system 10B (the prisms $PC_1$ to $PC_N$), the intervals among the laser luminous fluxes $L_1$ to $L_N$ decrease. As such a prismatic optical system 10B is provided, there is no need to cause the plurality of semiconductor laser array stacks $LS_1$ to $LS_N$ to be adjacent to each other. Therefore, cooling can be sufficiently performed by utilizing the gaps among the semiconductor laser array stacks $LS_1$ to $LS_N$, and since it is enough for a cooling device to have a simple configuration, the cooling device can be prevented from increasing in size. Moreover, since the laser luminous fluxes $L_1$ to $L_N$ can be collected through a simple configuration such as a prismatic optical system 10B, the laser device 1B can be miniaturized further.

In addition, the laser device 1B includes the imaging optical system 18 having a configuration similar to that of the above-described first embodiment. Accordingly, it is possible to enhance the uniformity of the quantity of the laser light at the predetermined position Q. For example, laser luminous fluxes having uniform light intensity can be applied to the irradiation target which is installed at the predetermined position Q. In addition, since the uniform N laser luminous fluxes $L_1$ to $L_N$ overlap each other at the predetermined position Q, even though deterioration is generated in a portion of any one of the semiconductor laser array stacks $LS_1$ to $LS_N$ and affects one laser luminous flux $L_n$ thereof, it is possible to retain the uniformity of the quantity of light of the laser luminous flux group LC by the remaining laser luminous fluxes.

Third Embodiment

Figure 6:
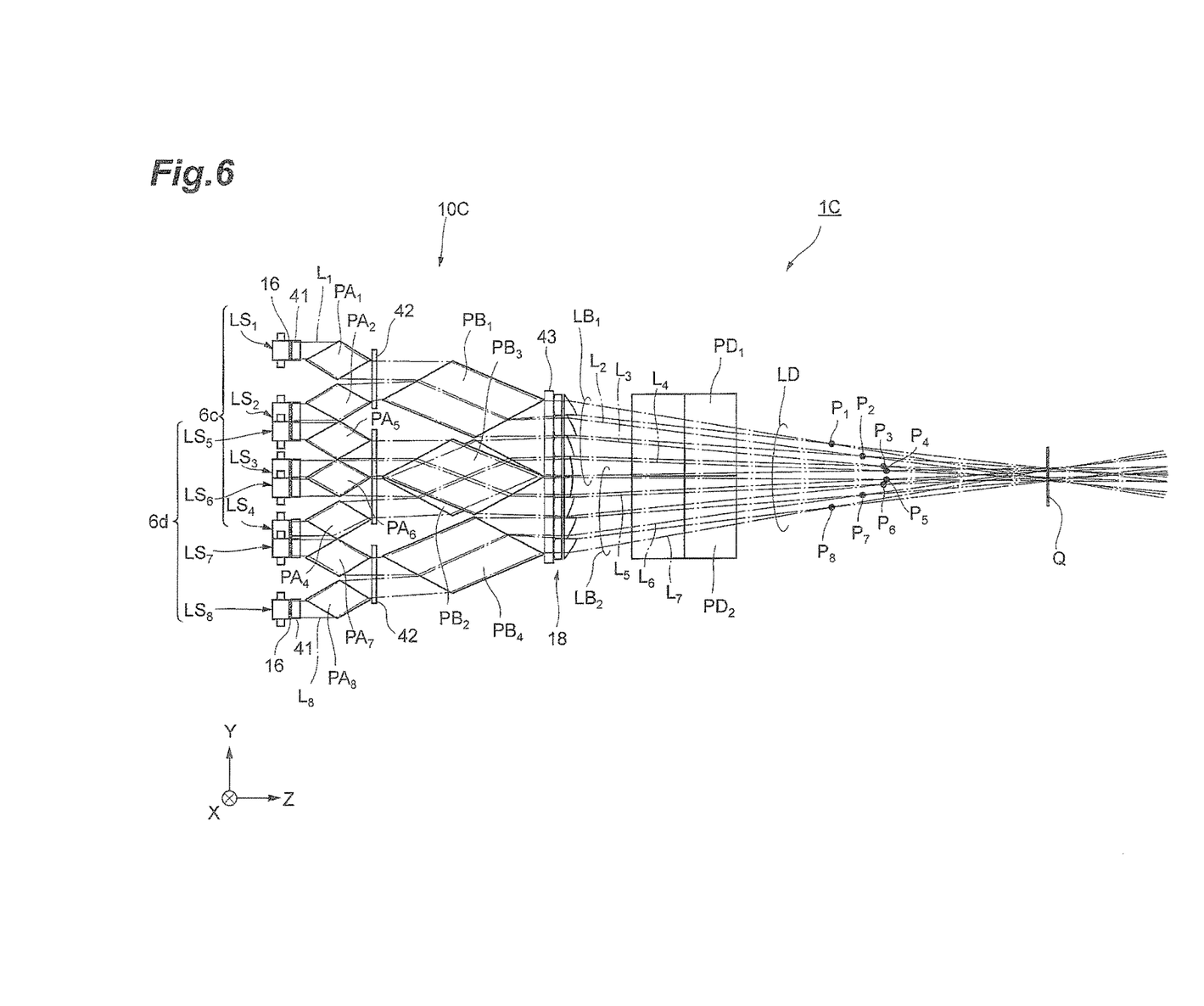
FIG. 6 is a plan view illustrating a configuration of a laser device of a third embodiment.
Figure 7:
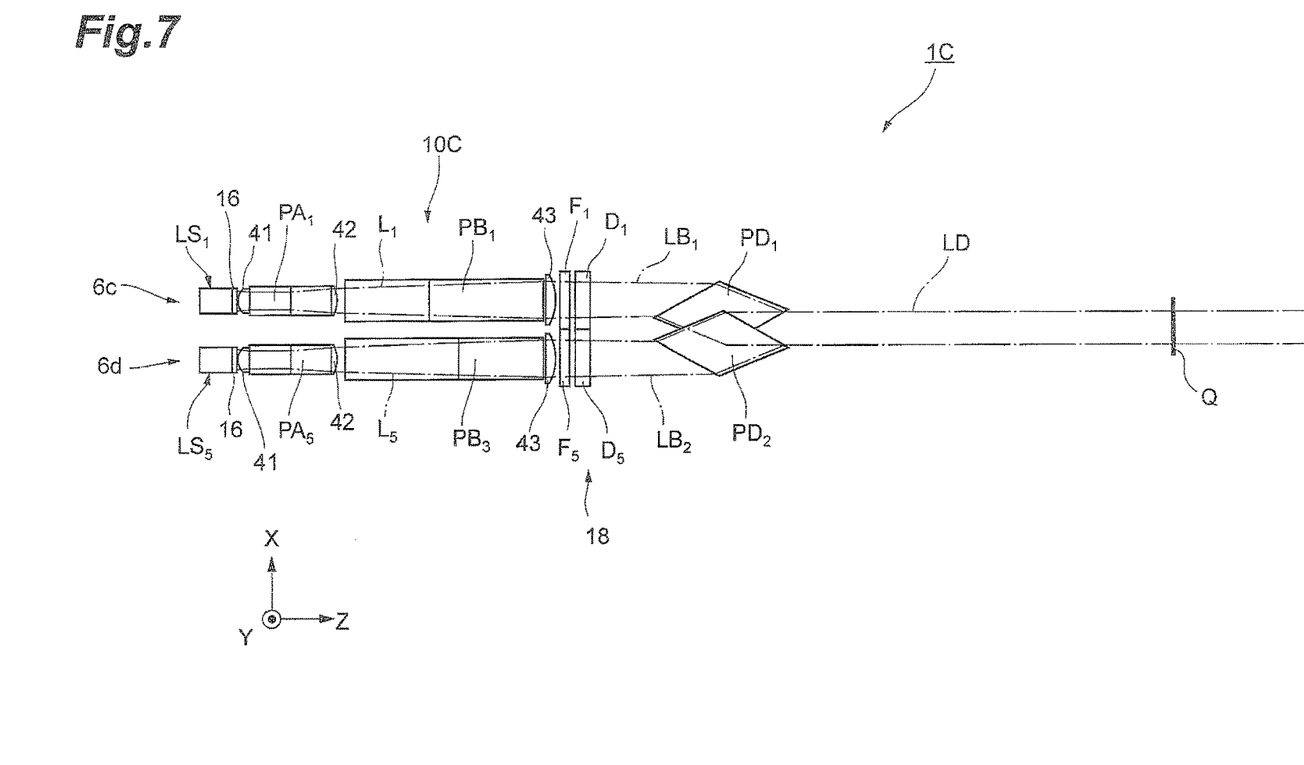
FIG. 7 is a side view of the laser device illustrated in FIG. 6 when viewed in the Y-axis direction.
Figure 8:
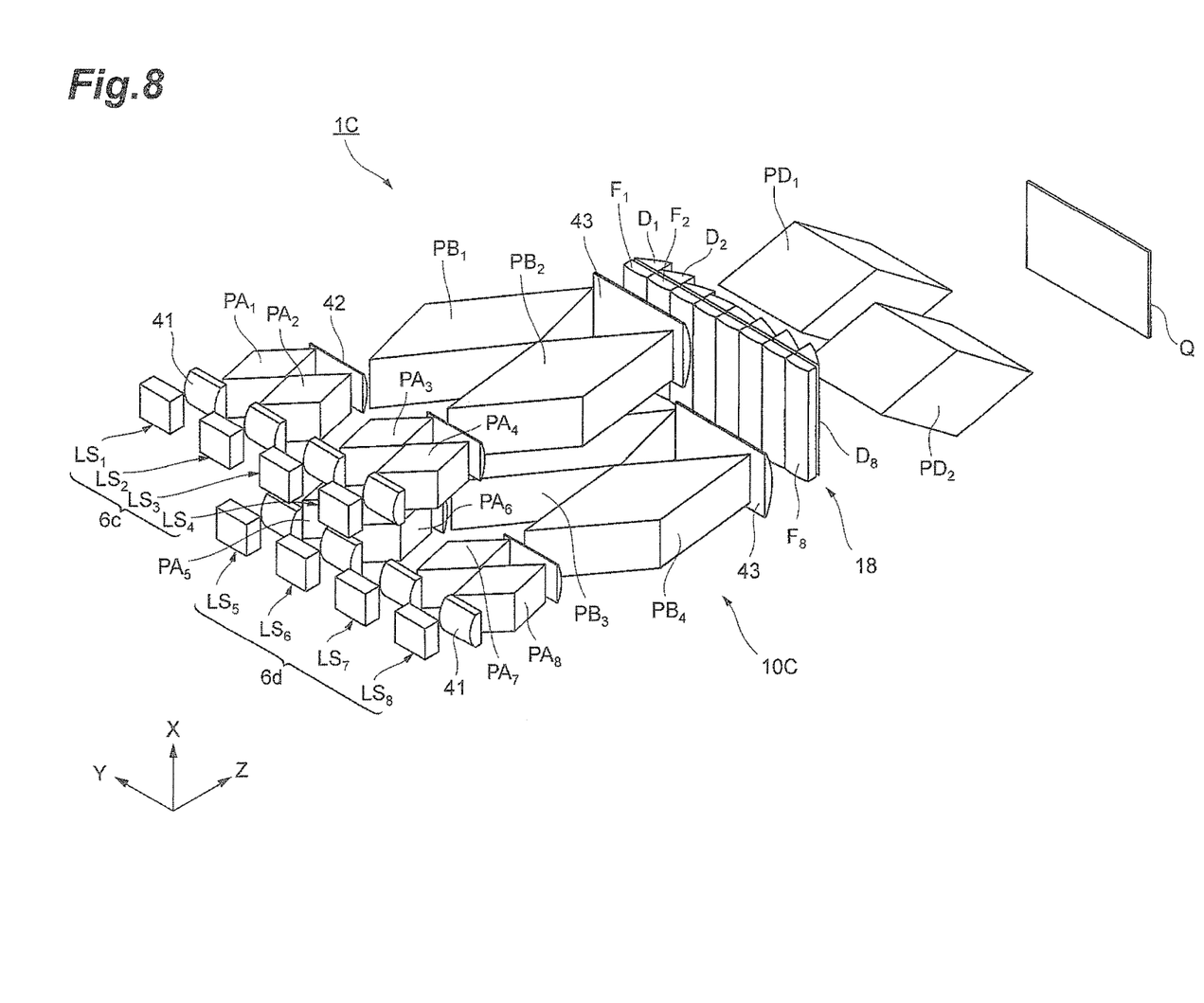
FIG. 8 is a perspective view illustrating the configuration of the laser device illustrated in FIG. 6.

FIG. 6 is a plan view illustrating a configuration of a laser device 1C of a third embodiment. FIG. 7 is a side view of the laser device 1C illustrated in FIG. 6 when viewed in the Y-axis direction. FIG. 8 is a perspective view illustrating the configuration of the laser device 1C. In order to make the diagram easy to understand, illustration of the laser luminous flux is omitted in FIG. 8.

As illustrated in FIGS. 6 to 8, the laser device 1C of the present embodiment includes the N semiconductor laser array stacks $LS_1$ to $LS_N$ (N is an integer of two or more. The diagram exemplifies a case of N=8), a prismatic optical system 10C, the collimator lens stack 16, and the imaging optical system 18. Since the configurations of the semiconductor laser array stacks $LS_1$ to $LS_N$ themselves, the disposition and the configuration of the collimator lens stack 16, and the configuration of the imaging optical system 18 are similar to those of the above-described first embodiment, detailed descriptions thereof will be omitted.

Semiconductor laser array stacks $LS_1$ to $LS_J$ (in this case, J is an integer within a range from 2 to less than (N−1). The diagram exemplifies a case of J=4) among the N semiconductor laser array stacks $LS_1$ to $LS_N$ are configured to be included in a first group 6c. In addition, the remaining semiconductor laser array stacks $LS_{J+1}$ to $LS_N$ are configured to be included in a second group 6d. The first group 6c and the second group 6d are disposed alternately side by side in a predetermined direction (the X-axis direction). In addition, the semiconductor laser array stacks $LS_1$ to $LS_J$ included in the first group 6c are disposed side by side at intervals thereamong in the Y-axis direction. Similarly, the semiconductor laser array stacks $LS_{J+1}$ to $LS_N$ included in the second group 6d are disposed side by side at intervals thereamong in the Y-axis direction.

The prismatic optical system 10C has the N first prisms $PA_1$ to $PA_N$ which are provided so as to correspond to the semiconductor laser array stacks $LS_1$ to $LS_N$ in a one-to-one manner, the second prisms $PB_1$ to $PB_K$ (in this case, K=N/2), and third prisms $PD_1$ to $PD_M$ (in this case, M=N/4). The first prisms $PA_1$ to $PA_J$ among the N first prisms $PA_1$ to $PA_N$ are disposed side by side along the corresponding semiconductor laser array stacks $LS_1$ to $LS_J$ in the Y-axis direction, and the first prisms $PA_{J+1}$ to $PA_N$ are disposed side by side along the corresponding semiconductor laser array stacks $LS_{J+1}$ to $LS_N$ in the Y-axis direction. In addition, a prism column configured to include the first prisms $PA_1$ to $PA_J$ and a prism column configured to include the first prisms $PA_{J+1}$ to $PA_N$ are disposed alternately side by side in the X-axis direction.

The first prisms $PA_1$ to $PA_N$ respectively have configurations similar to the first prisms $PA_1$ to $PA_N$ of the first embodiment. In other words, each of the first prisms $PA_1$ to $PA_N$ has a parallelogram shape including the light incident surface 21 and the light emission surface 22. The nth first prism $PA_n$ shifts the optical axis of the laser luminous flux $L_n$ in the direction intersecting the optical axis (the Y-axis direction in the present embodiment). In addition, the (2k−1)th first prism $PA_{2k-1}$ and the 2kth first prism $PA_{2k}$ are disposed adjacent to each other in the Y-axis direction. The laser luminous flux $L_{2k-1}$ incident on the light incident surface 21 of the first prism $PA_{2k-1}$ is refracted in a direction of approaching an adjacent laser luminous flux $L_{2k}$. In addition, the laser luminous flux La incident on the light incident surface 21 of the first prism $PA_{2k}$ is refracted in a direction of approaching an adjacent laser luminous flux $L_{2k-1}$. Accordingly, when the laser luminous fluxes $L_{2k-1}$ and La are emitted from the light emission surface 22, the interval between the laser luminous fluxes $L_{2k-1}$ and $L_{2k}$ decreases, thereby forming the laser luminous flux group $LA_k$ configured to include the pair of luminous fluxes $L_{2k-1}$ and $L_{2k}$. The laser luminous flux group $LA_k$ travels in the original light emission direction (the Z-axis direction).

The second prisms $PB_1$ to $PB_K$ respectively have configurations similar to the second prisms $PB_1$ to $PB_K$ of the first embodiment. In other words, the second prisms $PB_1$ to $PB_K$ has a parallelogram shape including the light incident surface 23 and the light emission surface 24. The kth second prism $PB_k$ shifts the optical axis of the laser luminous flux group $LA_k$ in the direction intersecting the optical axis (the Y-axis direction in the present embodiment). In addition, the (2m−1)th second prism $PB_{2m-1}$ and the 2mth second prism $PB_{2m}$ are disposed adjacent to each other in the Y-axis direction. The laser luminous flux group $LA_{2m-1}$ incident on the light incident surface 23 of the second prism $PB_{2m-1}$ is refracted in a direction of approaching an adjacent laser luminous flux group $LA_{2m}$. In addition, the laser luminous flux group $LA_{2m}$ incident on the light incident surface 23 of the second prism $PB_{2m}$ is refracted in a direction of approaching an adjacent laser luminous flux group $LA_{2m-1}$. Accordingly, when the laser luminous flux groups $LA_{2m-1}$ and $LA_{2m}$ are emitted from the light emission surface 24, the interval between the laser luminous flux groups $LA_{2m-1}$ and $LA_{2m}$ decreases, thereby forming the laser luminous flux group $LB_m$ configured to include the pair of laser luminous flux groups $LA_{2m-1}$ and $LA_{2m}$. The laser luminous flux group $LB_m$ travels in the original light emission direction (the Z-axis direction).

Each of the third prisms $PD_1$ to $PD_M$ is a prism made from a transparent material such as glass and quartz, for example, and has a light incident surface 27 and a light emission surface 28. In each of the third prisms $PD_1$ to $PD_M$ of the present embodiment, a cross section along the XZ plane exhibits a parallelogram (for example, a rhombic shape). One side of the parallelogram serves as the light incident surface 27, and a different side parallel to the one side serves as the light emission surface 28.

The laser luminous flux group $LB_m$ emitted from the second prisms $PB_{2m-1}$ and $PB_{2m}$ is incident on the light incident surface 27 of the mth third prism $PD_m$. The third prism $PD_m$ allows the laser luminous flux group $LB_m$ incident on the light incident surface 27 to penetrate therethrough and emits the laser luminous flux group $LB_m$ from the light emission surface 28. The light incident surface 27 tilts to the YZ plane, and when the laser luminous flux group $LB_m$ is incident on the light incident surface 27, the laser luminous flux group $LB_m$ is refracted by the above-described angle with respect to the light emission direction (the Z-axis direction). In addition, the light emission surface 28 is parallel to the light incident surface 27, and when the laser luminous flux group $LB_m$ is emitted from the light emission surface 28, the laser luminous flux group $LB_m$ is refracted again by the above-described angle in a direction opposite to that of the previous refraction, thereby travelling again in the light emission direction (the Z-axis direction). In this manner, the third prism $PD_m$ shifts the optical axis of the laser luminous flux group $LB_m$ in a direction intersecting the optical axis (the X-axis direction in the present embodiment). In other words, the third prism $PD_m$ causes the optical axis of the laser luminous flux group $LB_m$ emitted from the light emission surface 28 to move in the X-axis direction while being substantially parallel to the optical axis of the laser luminous flux group $LB_m$ incident on the light incident surface 27.

In addition, in the present embodiment, a laser luminous flux group $LB_{2i-1}$ incident on a (2i−1)th third prism $PD_{2i-1}$ (in this case, i is an integer within a range from 1 to I. I=N/8) is refracted in a direction of approaching an adjacent laser luminous flux group $LB_{2i}$ (for example, the negative X-axis direction), and the laser luminous flux group $LB_{2i}$ incident on a (2i)th third prism $PD_{2i}$ is refracted in a direction of approaching an adjacent laser luminous flux group $LB_{2i-1}$ (for example, the positive X-axis direction). Accordingly, when the laser luminous flux groups $LB_m$ are emitted from the light emission surface 28, the interval between the laser luminous flux group $LB_{2i-1}$ and the laser luminous flux group $LB_{2i}$ decreases, thereby forming a single laser luminous flux group LD configured to include laser luminous flux groups $LB_1$ to $LB_M$.

In the present embodiment, the third prisms $PD_1$ to $PD_M$ are disposed between the imaging optical system 18 and condensing positions $P_1$ to $P_N$. However, the third prisms $PD_1$ to $PD_M$ may be disposed between the second prisms $PB_1$ to $PB_K$ and the imaging optical system 18.

In the laser device 1C of the present embodiment having the above-described configuration, as the optical axes of the laser luminous fluxes $L_1$ to $L_N$ respectively emitted from the N semiconductor laser array stacks $LS_1$ to $LS_N$ are sifted by the prismatic optical system 10C (the first prisms $PA_1$ to $PA_N$, the second prisms $PB_1$ to $PB_K$, and the third prisms $PD_1$ to $PD_M$), the intervals among the laser luminous fluxes $L_1$ to $L_N$ decrease. As such a prismatic optical system 10C is provided, there is no need to cause the plurality of semiconductor laser array stacks $LS_1$ to $LS_N$ to be adjacent to each other. Therefore, cooling can be sufficiently performed by utilizing the gaps among the semiconductor laser array stacks $LS_1$ to $LS_N$, and since it is enough for a cooling device to have a simple configuration, the cooling device can be prevented from increasing in size. Moreover, since the laser luminous fluxes $L_1$ to $L_N$ can be collected through a simple configuration such as a prismatic optical system 10C, the laser device 1C can be miniaturized further.

In addition, the laser device 1C includes the imaging optical system 18 having a configuration similar to that of the above-described first embodiment. Accordingly, it is possible to enhance the uniformity of the quantity of the laser light at the predetermined position Q. For example, laser luminous fluxes having uniform light intensity can be applied to the irradiation target which is installed at the predetermined position Q. In addition, since the uniform N laser luminous fluxes $L_1$ to $L_N$ overlap each other at the predetermined position Q, even though deterioration is generated in a portion of any one of the semiconductor laser array stacks $LS_1$ to $LS_N$ and affects one laser luminous flux $L_n$ thereof, it is possible to retain the uniformity of the quantity of light of the laser luminous flux group LD by the remaining laser luminous fluxes.

The laser device according to an aspect of the present invention is not limited to the above-described embodiments and various other modifications can be made. For example, the first embodiment exemplifies a case where the number N of the semiconductor laser array stacks is 4, and the second embodiment and the third embodiment exemplify a case where the number N thereof is 8. However, in the laser device according to the aspect of the present invention, there is no limitation on the number of the semiconductor laser array stacks, and it is possible to combine arbitrary numbers of the semiconductor laser array stacks.

INDUSTRIAL APPLICABILITY

According to a laser device of an aspect of the present invention, there is no need to cause a plurality of semiconductor laser array stacks to be adjacent to each other, and even though deterioration is generated in a portion of the semiconductor laser array stacks, it is possible to retain the uniformity of the quantity of a laser light in an irradiation target.

REFERENCE SIGNS LIST

1A, 1B, 1C . . . laser device; 10A, 10B, 10C . . . prismatic optical system; 12 . . . semiconductor laser array; 14 . . . light emission region; 16 . . . collimator lens stack; 18 . . . imaging optical system; 21, 23, 25, 27 . . . light incident surface; 22, 24, 26, 28 . . . light emission surface; 41 to 46 . . . slow axis collimator lens; $D_1$ to $D_N$ . . . deflection optical element; $F_1$ to $F_N$ . . . imaging lens; $L_1$ to $L_N$ . . . laser luminous flux; La . . . laser light; $LA_1$ to $LA_K$ . . . laser luminous flux group; $LB_1$ to $LB_M$ . . . laser luminous flux group; LC . . . laser luminous flux group; LD . . . laser luminous flux group; $LS_1$ to $LS_N$ . . . semiconductor laser array stack; $P_1$ to $P_N$ . . . light-condensing point; $PA_1$ to $PA_N$ . . . first prism; $PB_1$ to $PB_K$ . . . second prism; $PC_1$ to $PC_N$ . . . prism; $PD_1$ to $PD_M$ . . . third prism; Q . . . predetermined position.

The invention claimed is:

1. A laser device comprising:
   N semiconductor laser array stacks (N is an integer of two or more) that are configured to include a plurality of semiconductor laser arrays each of which emits laser lights from two or more light emission regions being arranged in a predetermined direction while having emission directions aligned and which are stacked in a stacking direction intersecting the predetermined direction and the emission direction, and output the laser lights respectively emitted from the plurality of semiconductor laser arrays as one luminous flux;
   a first collimation portion that performs collimation in a fast axis direction for the laser lights included in the luminous flux;
   a prismatic optical system that allows the luminous fluxes which are respectively output from the N semiconductor laser array stacks and pass through the first collimation portion to penetrate therethrough, and shifts an optical axis of the luminous flux in a direction intersecting the optical axis so as to decrease an interval between the luminous fluxes; and
   an imaging optical system that condenses the luminous fluxes respectively output from the N semiconductor laser array stacks within a plane intersecting a slow axis direction for each luminous flux and deflects the optical axis of each of the luminous fluxes within the plane for each luminous flux,
   wherein the imaging optical system deflects each of the luminous fluxes so that the N luminous fluxes overlap each other at a predetermined position and generates a focal point of each of the luminous fluxes between the imaging optical system and the predetermined position, wherein the focal points of each of the luminous fluxes are spatially separated.

2. The laser device according to claim 1, wherein the imaging optical system includes N imaging lenses which condense each of the luminous fluxes respectively output from the N semiconductor laser array stacks for each luminous flux and N deflection optical elements which deflect the optical axes of each of the luminous fluxes for each luminous flux.

3. The laser device according to claim 1, wherein the N semiconductor laser array stacks are disposed side by side in the stacking direction, and wherein the prismatic optical system shifts the optical axis of the luminous flux in the stacking direction.

4. The laser device according to claim 1, wherein a first group which includes one or a plurality of the semiconductor laser array stacks and a second group which includes one or the plurality of semiconductor laser array stacks are disposed side by side in a predetermined direction, and wherein the prismatic optical system shifts the optical axis of the luminous flux in the predetermined direction so as to decrease an interval between the luminous flux emitted from the semiconductor laser array stack included in the first group and the luminous flux emitted from the semiconductor laser array stack included in the second group.

\* \* \* \* \*